(12) United States Patent
Ko et al.

(10) Patent No.: US 12,224,235 B2
(45) Date of Patent: Feb. 11, 2025

(54) PRINTED CIRCUIT BOARD

(71) Applicant: SAMSUNG ELECTRO-MECHANICS CO., LTD., Suwon-si (KR)

(72) Inventors: Chan Hoon Ko, Suwon-si (KR); Sang Hoon Kim, Suwon-si (KR); Yoong Oh, Suwon-si (KR); Hea Sung Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 18/211,093

(22) Filed: Jun. 16, 2023

(65) Prior Publication Data

US 2023/0335479 A1    Oct. 19, 2023

Related U.S. Application Data

(63) Continuation of application No. 17/191,485, filed on Mar. 3, 2021, now abandoned.

(30) Foreign Application Priority Data

Dec. 8, 2020  (KR) .................. 10-2020-0170429

(51) Int. Cl.
*H05K 1/11* (2006.01)
*H01L 23/498* (2006.01)

(52) U.S. Cl.
CPC .. *H01L 23/49838* (2013.01); *H01L 23/49811* (2013.01); *H05K 1/111* (2013.01);
(Continued)

(58) Field of Classification Search
CPC ........... H01L 23/49838; H01L 21/4846; H01L 23/49811; H01L 23/49822; H01L 21/4857;
(Continued)

(56) References Cited

U.S. PATENT DOCUMENTS

| 5,283,948 A | 2/1994 | Schroeder et al. |
| 2005/0017375 A1* | 1/2005 | Ko .................. H05K 1/111 257/782 |

(Continued)

FOREIGN PATENT DOCUMENTS

| KR | 10-1440249 B1 | 9/2014 |
| KR | 10-1548428 B1 | 8/2015 |

(Continued)

OTHER PUBLICATIONS

Final Office Action issued in corresponding U.S. Appl. No. 17/191,485 dated Apr. 3, 2023.

(Continued)

*Primary Examiner* — Steven T Sawyer
(74) *Attorney, Agent, or Firm* — MORGAN, LEWIS & BOCKIUS LLP

(57) ABSTRACT

A printed circuit board includes a first insulating layer; a pad disposed on the insulating layer and having a protrusion; and a protective layer disposed on the insulating layer and having an opening exposing at least a portion of the pad. The protrusion protrudes from one surface of the pad and is buried in at least one of the insulating layer and the protective layer.

18 Claims, 12 Drawing Sheets

(52) U.S. Cl.
CPC .......... *H01L 23/49822* (2013.01); *H05K 2201/09472* (2013.01); *H05K 2201/098* (2013.01); *H05K 2201/099* (2013.01)

(58) Field of Classification Search
CPC ...... H01L 21/6835; H01L 2221/68345; H05K 1/111; H05K 3/18; H05K 3/241; H05K 3/28; H05K 2201/098; H05K 2203/0723; H05K 2201/0367; H05K 3/4682; H05K 1/115; H05K 1/185; H05K 2201/0379; H05K 2201/09472; H05K 2201/099
See application file for complete search history.

(56) References Cited

U.S. PATENT DOCUMENTS

| | | | |
|---|---|---|---|
| 2006/0035453 A1* | 2/2006 | Kim | H01L 23/49816 257/737 |
| 2006/0120056 A1 | 6/2006 | Sasaki | |
| 2007/0108572 A1 | 5/2007 | Hsu et al. | |
| 2007/0221942 A1* | 9/2007 | Jeong | H05K 3/045 257/99 |
| 2011/0100695 A1 | 5/2011 | Lin | |
| 2011/0200788 A1* | 8/2011 | Maeda | H05K 3/4682 216/14 |
| 2012/0067635 A1* | 3/2012 | Nang | B23K 3/0623 228/203 |
| 2012/0247819 A1* | 10/2012 | Tsuyutani | H01L 24/24 29/841 |
| 2014/0252598 A1 | 9/2014 | Yu et al. | |
| 2015/0014027 A1* | 1/2015 | Kaneko | H05K 1/113 174/255 |
| 2015/0061143 A1* | 3/2015 | Kim | H01L 23/528 438/618 |
| 2016/0021744 A1 | 1/2016 | Baek et al. | |
| 2016/0381796 A1* | 12/2016 | Lee | H05K 3/067 174/262 |
| 2017/0280560 A1 | 9/2017 | Park | |
| 2019/0380210 A1* | 12/2019 | Lin | H05K 3/4617 |

FOREIGN PATENT DOCUMENTS

| | | |
|---|---|---|
| KR | 10-2016-0010960 A | 1/2016 |
| KR | 10-2017-0067481 A | 6/2017 |
| KR | 10-2017-0090772 A | 8/2017 |
| KR | 10-2018-0013018 A | 2/2018 |
| KR | 10-2019-0046511 A | 5/2019 |

OTHER PUBLICATIONS

Office Action issued in corresponding U.S. Appl. No. 17/191,485 dated Oct. 26, 2022.

Office Action issued in corresponding Korean Patent Application No. 10-2020-0170429 dated Dec. 24, 2024, with English translation.

* cited by examiner

PRINTED CIRCUIT BOARD

CROSS-REFERENCE TO RELATED APPLICATION(S)

This application is the continuation application of U.S. patent application Ser. No. 17/191,485 filed on Mar. 3, 2021, which claims benefit of priority to Korean Patent Application No. 10-2020-0170429 filed on Dec. 8, 2020 in the Korean Intellectual Property Office, the disclosure of which is incorporated herein by reference in its entirety.

TECHNICAL FIELD

The present disclosure relates to a printed circuit board.

BACKGROUND

An electronic device such as a mobile product has been designed to have a reduced thickness and size, and has been required to have improved quality. To respond to this trend, a ball grid array (BGA) package product has been implemented to have a fine pitch using a conductive post. A metal such as copper may have a relatively higher Young's modulus and a higher aspect ratio than those of solder, which may lead to an increase in the force applied to a pad connected to a conductive post, and it may be necessary to reduce the magnitude of the force applied to the pad.

SUMMARY

An aspect of the present disclosure is to provide a printed circuit board including a pad having an increased contact area with an insulating material.

Another aspect of the present disclosure is to provide a printed circuit board including a plurality of inflection points.

Another aspect of the present disclosure is to provide a printed circuit board which may reduce force applied to a pad.

According to an example embodiment of the present disclosure, a printed circuit board includes a first insulating layer; a pad disposed on the insulating layer and having a protrusion; and a protective layer disposed on the insulating layer and having an opening exposing at least a portion of the pad. The protrusion protrudes from one surface of the pad and is buried in at least one of the insulating layer and the protective layer.

According to another example embodiment of the present disclosure, a printed circuit board includes an insulating layer; a pad buried in the insulating layer to be exposed to one surface of the insulating layer and including a first metal layer and a second metal layer disposed on the first metal layer; a protective layer disposed on the insulating layer and having an opening exposing at least a portion of the pad; and a conductive post disposed in the opening of the protective layer, protruding from the protective layer, and connected to the pad.

According to another example embodiment of the present disclosure, a printed circuit board includes an insulating body; a pad disposed in the insulating body and including a first metal layer and a second metal layer; and a conductive post extending from the first metal layer to protrude from the insulating body. The second metal layer is spaced apart from the conductive post.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the attached drawings.

Electronic Device

Figure 1:
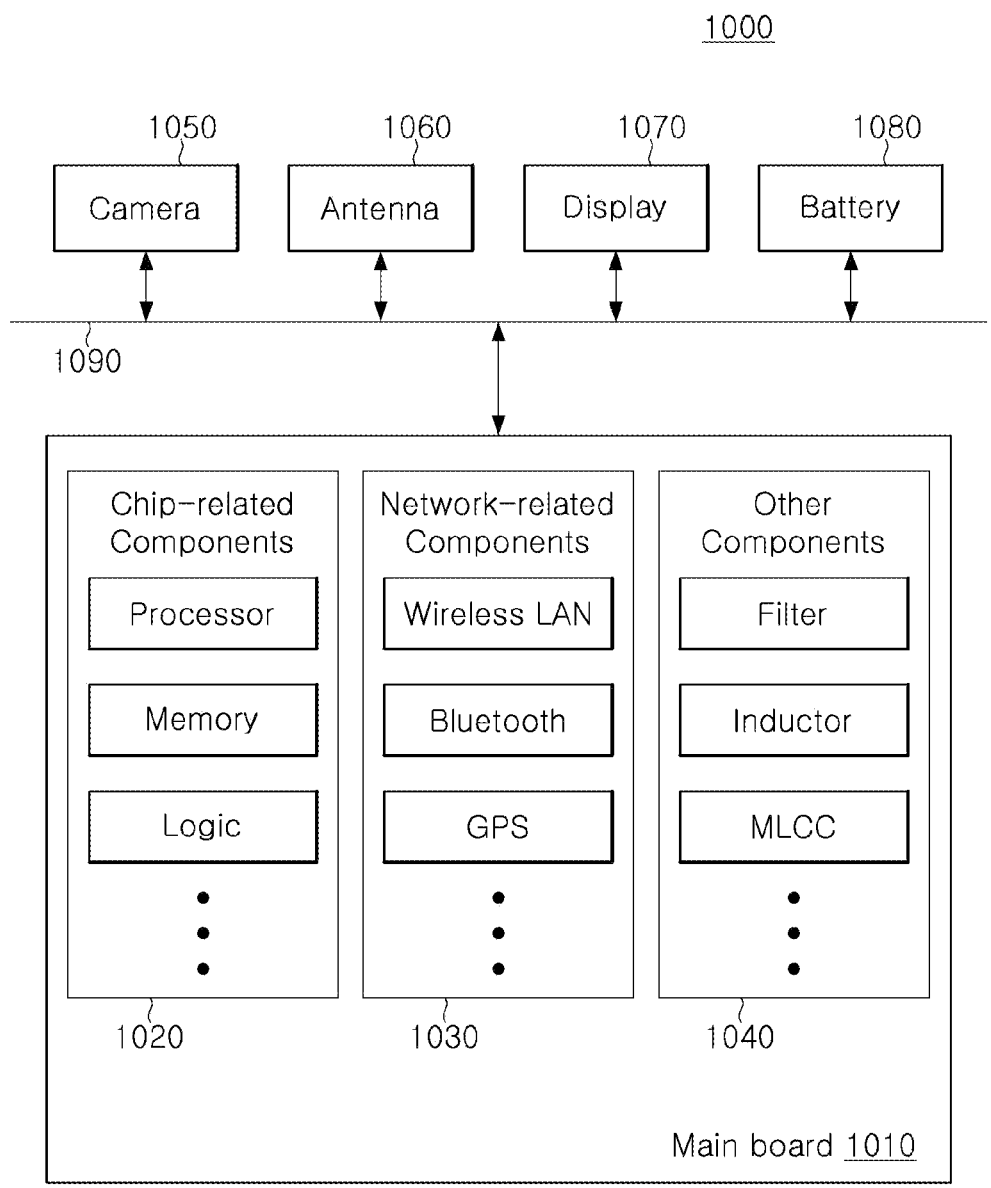
FIG. 1 is a block diagram illustrating an example of an electronic device system.

FIG. 1 is a block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related components. Also, the chip related components 1020 may be combined with each other. The chip related components 1020 may have a package form including the above-described chip or an electronic component.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+

(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, and may also include a variety of other wireless or wired standards or protocols. Also, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include chip-component type passive components used for various other purposes, or the like. Also, other components 1040 may be combined with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, and a battery 1080. However, an example embodiment thereof is not limited thereto, and these other components may include an audio codec, a video codec, a power amplifier, a compass, an accelerometer, a gyroscope, a speaker, amass storage unit (for example, a hard disk drive), a compact disk (CD) drive), a digital versatile disk (DVD) drive, or the like. In addition to the above examples, other components used for various purposes depending on a type of electronic device 1000, or the like, may be included.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
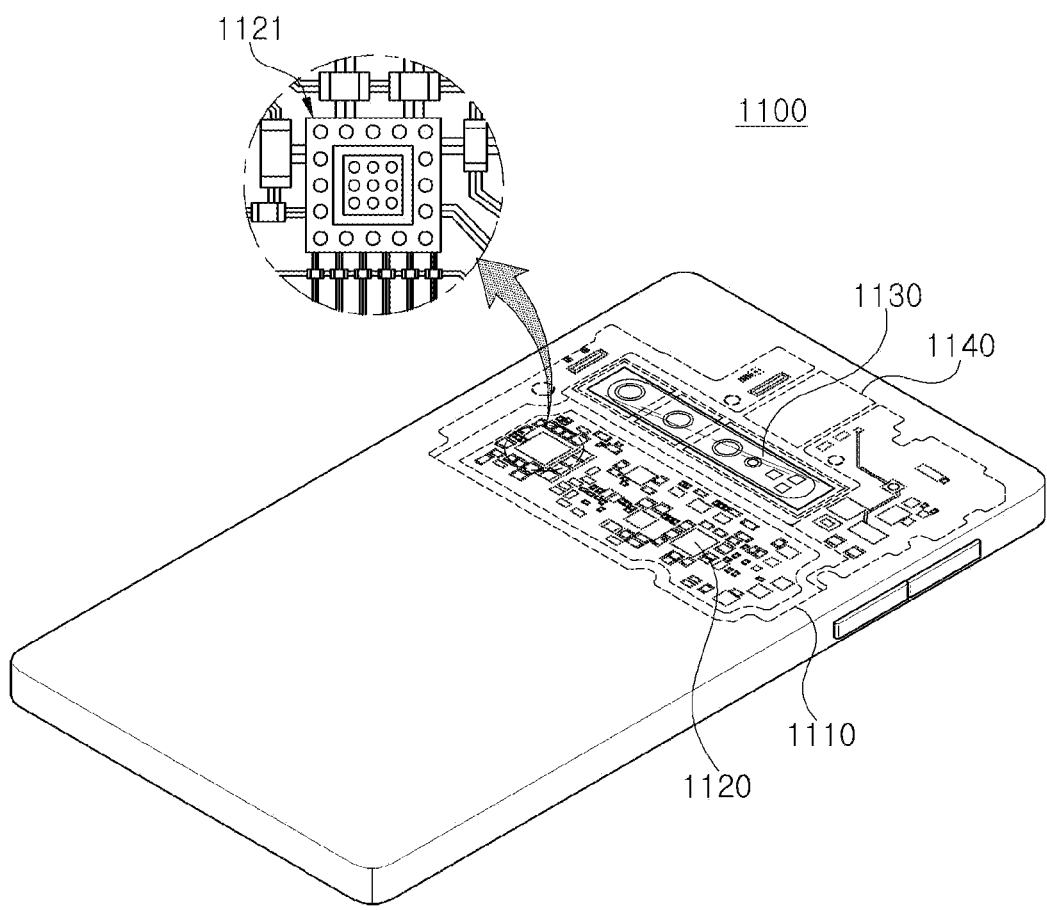
FIG. 2 is a perspective diagram illustrating an example of an electronic device.

FIG. 2 is a perspective diagram illustrating an example of an electronic device.

Referring to FIG. 2, the electronic device may be implemented by a smartphone 1100. A mainboard 1110 may be accommodated in a smartphone 1100, and various electronic components 1120 may be physically or electrically connected to the mainboard 1110. Other electronic components which may or may not be physically or electrically connected to the mainboard 1110, such as the camera module 1130 and/or the speaker 1140, may be accommodated therein. Some of the components 1120 may be the chip related components, such as a component package 1121, for example, but an example embodiment thereof is not limited thereto. In the component package 1121, electronic components may be disposed on a multilayer printed circuit board in the form of surface mounting, but an example embodiment thereof is not limited thereto. The electronic device is not necessarily limited to the smartphone 1100, and may be other electronic devices as described above.

Printed Circuit Board

Figure 3:
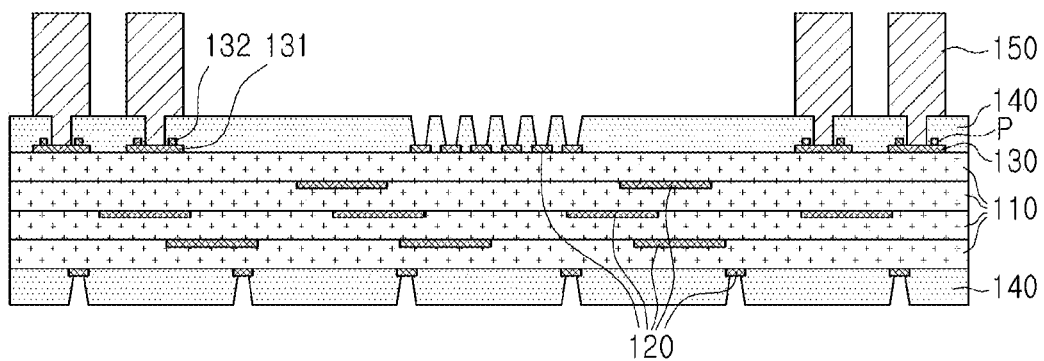
FIG. 3 is a cross-sectional diagram illustrating a printed circuit board according to an example embodiment.

FIG. 3 is a cross-sectional diagram illustrating a printed circuit board according to an example embodiment.

Referring to the diagram, a printed circuit board in the example embodiment may include an insulating layer 110, a wiring layer 120, a pad 130, a protective layer 140, and a conductive post 150.

The number of the insulating layers 110 is not limited to any particular example, and may be configured as a single insulating layer 110 or a plurality of insulating layers 110.

As a material for forming the first insulating layer 110, at least one of an insulating material such as a thermosetting resin such as an epoxy resin, a thermoplastic resin such as a polyimide resin, or resin in which the thermosetting resin or the thermoplastic resin is impregnated in a core material such as a glass fiber (glass cloth or glass fabic) with an inorganic filler, such as prepreg, an ajinomoto build-up film (ABF), FR-4, bismaleimide triazine (BT), or the like, may be used.

The wiring layer 120 may be formed on the insulating layer 110. The wiring layer 120 may be disposed on the insulating layer 120 or may be buried in the insulating layer 110. The wiring layer 120 may also be configured as a plurality of wiring layers 120, and in this case, the plurality of wiring layers 120 may be formed on the plurality of insulating layers 110, respectively.

As a material for forming the wiring layer 120, a conductive material such as copper (Cu), aluminum (Al), silver (Ag), tin (Sn), gold (Au), nickel (Ni), lead (Pb), titanium (Ti), or alloys thereof may be used. A method of forming the wiring layer 120 is not limited to any particular method, and a first plating layer working as a seed layer may be formed by electroless plating, and a second plating layer may be formed on the first plating layer by electrolytic plating, thereby forming the wiring layer 120. In this case, the wiring layer 120 may include a plurality of metal layers.

Although not specifically illustrated in the diagram, the printed circuit board in the example embodiment may further include a via penetrating the insulating layer 110 and connecting the wiring layers 120 and the pad 130 disposed on different levels to each other.

The pad 130 may be formed on the insulating layer 110, and may have a protrusion P. The protrusion P may protrude from one surface of the pad 130, and a region protruding from the one surface of the pad 130 may form the protrusion P.

The protrusion P may be configured as a plurality of protrusions P spaced apart from each other. The number of the plurality of protrusions P is not limited to any particular example, and the protrusion P may have a greater number of protrusions P than the example illustrated in the diagram.

The protrusion P of the printed circuit board in an example embodiment may be buried in the protective layer 140.

The pad 130 may include a first metal layer 131 and a second metal layer 132 disposed on the first metal layer 131. The first metal layer 131 and the second metal layer 132 may have a boundary therebetween and may be distinct from each other.

The first metal layer 131 may be disposed on the insulating layer 110, and the second metal layer 132 may be disposed on a surface opposite to the surface of the first metal layer 131 opposing the insulating layer 110. Referring to the diagram, the first metal layer 131 may be disposed on an upper portion of the insulating layer 110, and the second metal layer 132 may be disposed on the upper surface of the first metal layer 131.

In this case, the second metal layer 132 may form the protrusion P, and accordingly, the second metal layer 132 forming the protrusion P may be buried in the protective layer 140.

A width of the first metal layer 131 may be different from a width of the second metal layer 132. Specifically, the width of the second metal layer 132 forming the protrusion P may be narrower than the width of the first metal layer 131.

One surface of the pad 130 on which the protrusion P is formed may be coplanar with a boundary between the first metal layer 131 and the second metal layer 132. One surface of the pad 130 may be the same as one surface of the first metal layer 131, and the second metal layer 132 forming the protrusion P may protrude from one surface of the first metal layer 131, thereby having the above-described structure.

As a material for forming each of the first metal layer 131 and the second metal layer 132, a conductive material such as copper (Cu), aluminum (Al), silver (Ag), tin (Sn), gold (Au), nickel (Ni), lead (Pb), titanium (Ti), or alloys thereof may be used.

Each of the first metal layer 131 and the second metal layer 132 is not limited to a single metal layer. For example, depending on a manufacturing process, the first metal layer 131 may have a multilayer structure including a seed layer and a plating layer. The second metal layer 132 may also have a multilayer structure.

The protective layer 140 may be disposed on the insulating layer 110 and may have an opening exposing at least a portion of the pad 130. The protective layer 140 may be disposed on at least one of both sides of the insulating layer 110, and may be disposed on the insulating layer 110 disposed on an uppermost side and/or a lowermost side of the plurality of insulating layers 110.

Since the second metal layer 132 of the printed circuit board in an example embodiment is buried in the protective layer 140, a portion of the pad 130 exposed by the protective layer 140 may be configured as a portion of the first metal layer 131. Specifically, the opening of the protective layer 140 may be formed in a region other than the region in which the second metal layer 132 is disposed and may expose the first metal layer 131.

Also, the protective layer 140 may further have an opening exposing a portion of the wiring layer 120. For example, the protective layer 140 may further have an opening exposing a portion of each of the wiring layers 120 disposed on an uppermost side and/or a lowermost side of the wiring layer 120.

The protective layer 140 may be configured as a solder resist (SR) layer. However, an example embodiment thereof is not limited thereto, and a generally used insulating material such as Ajinomoto Build-up Film (ABF) may be used as a material for forming the protective layer 140.

The conductive post 150 may be disposed on the insulating layer 110 and may be connected to the pad 110.

The conductive post 150 may fill the opening of the protective layer 140 and may be formed to protrude from the protective layer 140. The conductive post 150 may have a columnar shape, but an example embodiment thereof is not limited thereto.

As a material for forming the conductive post 150, a conductive material such as copper (Cu), aluminum (Al), silver (Ag), tin (Sn), gold (Au), nickel (Ni), lead (Pb), titanium (Ti), or alloys thereof, may be used.

As the pad 130 of the printed circuit board in an example embodiment includes the protrusion P, a contact area with the protective layer 140 may increase. Also, as the pad 130 of the printed circuit board in an example embodiment includes the protrusion P, the pad 130 may have a plurality of inflection points. Accordingly, the force applied to the pad 130 may be reduced due to the conductive post 150.

Figure 4:
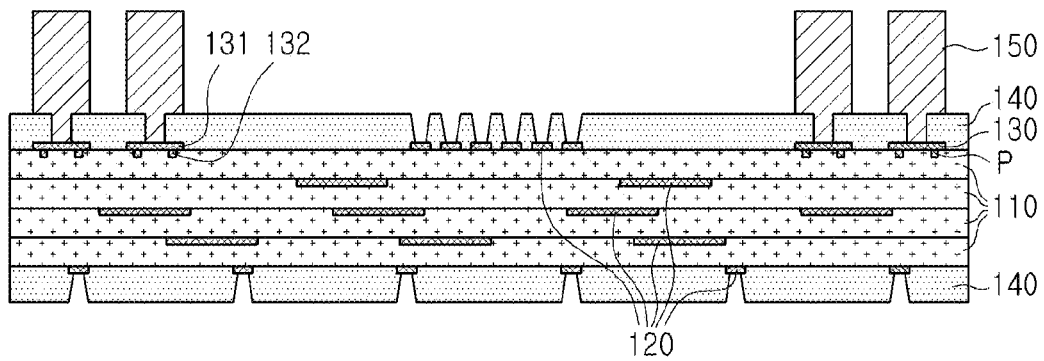
FIG. 4 is a cross-sectional diagram illustrating a printed circuit board according to another example embodiment.

FIG. 4 is a cross-sectional diagram illustrating a printed circuit board according to another example embodiment.

As for the printed circuit board according to another example embodiment, a structure of the pad 130 may be different from that of the pad 130 of the printed circuit board in FIG. 3. Thus, the pad 130 of the printed circuit board according to another example embodiment will be described hereinafter.

The pad 130 may be formed on the insulating layer 110, and may have a protrusion P. The protrusion P may protrude from one surface of the pad 130, and a region protruding from the one surface of the pad 130 may form the protrusion P.

The protrusions P may be configured as a plurality of protrusions P spaced apart from each other. The number of the plurality of protrusions P is not limited to any particular example, and the protrusions P may have a greater number of protrusions P than the example illustrated in the diagram.

In the printed circuit board in another example embodiment, the protrusion P may be buried in the insulating layer 110.

The pad 130 may include a first metal layer 131 and a second metal layer 132 disposed on the first metal layer 131. The first metal layer 131 and the second metal layer 132 may have a boundary therebetween and may be distinct from each other.

The first metal layer 131 may be disposed on the insulating layer 110, and the second metal layer 132 may be disposed on a surface of the first metal layer 131 opposing the insulating layer 110. Referring to the diagram, the first metal layer 131 may be disposed on an upper side of the insulating layer 110 and the second metal layer 132 may be disposed on a lower surface of the first metal layer 131. The second metal layer 132 may be buried in the insulating layer 110, and in this case, one surface of the second metal layer 132 may be coplanar with one surface of the insulating layer 110.

In this case, the second metal layer 132 may form the protrusion P, and thus, the second metal layer 132 may be buried in the insulating layer 110.

A width of the first metal layer 131 may be different from a width of the second metal layer 132. Specifically, the width of the second metal layer 132 forming the protrusion P may be narrower than the width of the first metal layer 131.

One surface of the pad 130 on which the protrusion P is formed may be coplanar with a boundary between the first metal layer 131 and the second metal layer 132. One surface of the pad 130 may be the same as one surface of the first metal layer 131, and the second metal layer 132 forming the protrusion P may protrude from one surface of the first metal layer 131, thereby having the above-described structure.

As a material for forming each of the first metal layer 131 and the second metal layer 132, a conductive material such as copper (Cu), aluminum (Al), silver (Ag), tin (Sn), gold (Au), nickel (Ni), lead (Pb), titanium (Ti), or alloys thereof may be used.

Each of the first metal layer 131 and the second metal layer 132 is not limited to a single metal layer. For example, depending on a manufacturing process, the first metal layer 131 may have a multilayer structure including a seed layer and a plating layer. The second metal layer 132 may also have a multilayer structure.

As the pad 130 of the printed circuit board in an example embodiment includes the protrusion P, a contact area with the insulating layer 110 may increase. Also, as the pad 130 of the printed circuit board in an example embodiment includes the protrusion P, the pad 130 may have a plurality of inflection points. Accordingly, the force applied to the pad 130 may be reduced due to the conductive post 150.

The descriptions of the other elements may be substantially the same as in the aforementioned example embodiment with reference to FIG. 3, and thus, detailed descriptions thereof will not be provided.

Figure 5:
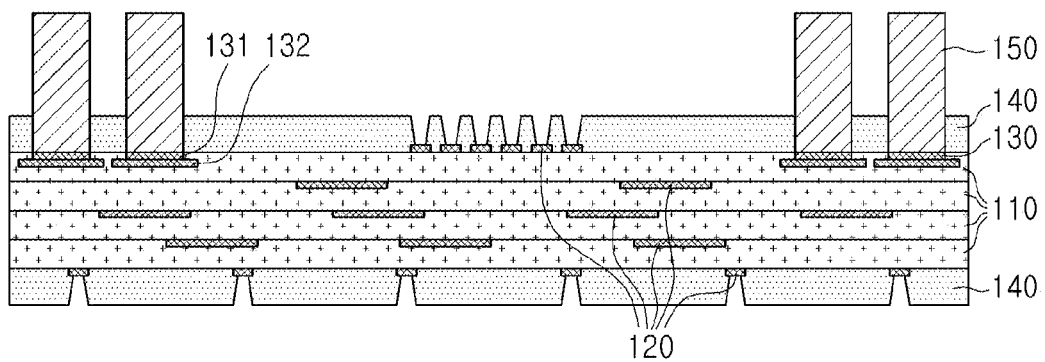
FIG. 5 is a cross-sectional diagram illustrating a printed circuit board according to another example embodiment.

FIG. 5 is a cross-sectional diagram illustrating a printed circuit board according to another example embodiment.

As for the printed circuit board according to another example embodiment, a structure of the pad 130 may be different from that of the pad 130 of the printed circuit board in FIG. 3. Thus, the pad 130 of the printed circuit board according to another example embodiment will be described.

The pad 130 may be buried in the insulating layer 110 to be exposed to one surface of the insulating layer 110, and may include a first metal layer 131 and a second metal layer 132 disposed on the first metal layer 131. The first metal layer 131 and the second metal layer 132 may have a boundary therebetween and may be distinct from each other.

The pad 130 may be buried in the insulating layer 110 such that one surface of the first metal layer 131 may be exposed to one surface of the insulating layer 110. Referring to the diagram, the second metal layer 132 may be disposed on the lower surface of the first metal layer 131, and may be buried in the insulating layer 110 such that the upper surface of the first metal layer 131 may be exposed to the upper surface of the insulating layer 110.

One surface of the pad 130 may be coplanar with one surface of the insulating layer 110. One surface of the pad 130 may be the same as one surface of the first metal layer 131, and thus, one surface of the first metal layer 131 may be coplanar with one surface of the insulating layer 110.

A width of the first metal layer 131 may be different from a width of the second metal layer 132. For example, as illustrated in the diagram, the width of the first metal layer 131 may be narrower than the width of the second metal layer 132. Alternatively, the width of the second metal layer 132 may be narrower than the width of the first metal layer 131.

The pad 130 may include a region having a stepped portion. Specifically, the pad 130 may include a region in which the first metal layer 131 is not formed on the second metal layer 132, such that a stepped portion may be formed between the region in which both the first metal layer 131 and the second metal layer 132 are formed and the region in which only the second metal layer 132 is formed.

As a material for forming each of the first metal layer 131 and the second metal layer 132, a conductive material such as copper (Cu), aluminum (Al), silver (Ag), tin (Sn), gold (Au), nickel (Ni), lead (Pb), titanium (Ti), or alloys thereof may be used.

Each of the first metal layer 131 and the second metal layer 132 is not limited to a single metal layer. For example, depending on a manufacturing process, the first metal layer 131 may have a multilayer structure including a seed layer and a plating layer. The second metal layer 132 may also have a multilayer structure.

In the printed circuit board according to another example embodiment, the pad may include a region having a stepped portion, such that a contact area with the insulating layer 110 may increase. Also, as the pad 130 of the printed circuit board in the example embodiment includes the region having a stepped portion, the pad 130 may have a plurality of inflection points. Accordingly, the force applied to the pad 130 may be reduced due to the conductive post 150.

The descriptions of the other elements may be substantially the same as in the aforementioned example embodiment with reference to FIG. 3, and thus, detailed descriptions thereof will not be provided.

Figure 6:
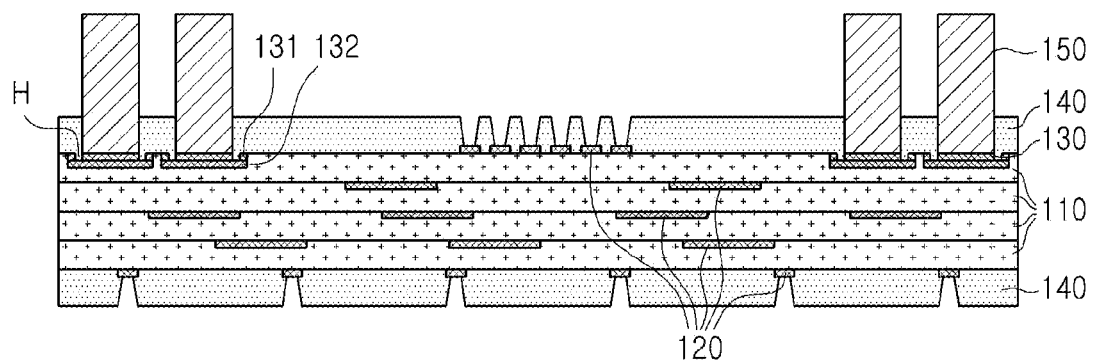
FIG. 6 is a cross-sectional diagram illustrating a printed circuit board according to another example embodiment.

FIG. 6 is a cross-sectional diagram illustrating a printed circuit board according to another example embodiment.

As for the printed circuit board according to another example embodiment, a structure of the pad 130 may be different from that of the pad 130 of the printed circuit board in FIGS. 3 and 5. Thus, the pad 130 of the printed circuit board according to another example embodiment will be described.

The pad 130 may be buried in the insulating layer 110 to be exposed to one surface of the insulating layer 110, and may include a first metal layer 131 and a second metal layer 132 disposed on the first metal layer 131. The first metal layer 131 and the second metal layer 132 may have a boundary therebetween and may be distinct from each other.

The pad 130 may be buried in the insulating layer 110 such that one surface of the first metal layer 131 may be exposed to one surface of the insulating layer 110. Referring to the diagram, the second metal layer 132 may be disposed on a lower surface of the first metal layer 131, and may be buried in the insulating layer 110 such that the upper surface of the first metal layer 131 may be exposed to the upper surface of the insulating layer 110.

One surface of the pad 130 may be coplanar with one surface of the insulating layer 110. One surface of the pad 130 may be the same as one surface of the first metal layer 131, and thus, one surface of the first metal layer 131 may be coplanar with one surface of the insulating layer 110.

A width of the first metal layer 131 may be the same as or different from a width of the second metal layer 132.

The pad 130 may include a region having a stepped portion. Specifically, the pad 130 may include a through-portion H formed in the first metal layer 131 and exposing the second metal layer 132, such that a stepped portion may be formed between the region in which both the first metal layer 131 and the second metal layer 132 are formed as the through-portion H is not formed and the region in which only the second metal layer 132 is formed as the through-portion H is formed. The region of the pad 130 having a stepped portion may be configured as a concave region (or a groove portion) due to the through-portion H.

The through-portion H may be filled with the protective layer 140. Also, the through-portions H may be configured as a plurality of through-portions H spaced apart from each other.

As a material for forming each of the first metal layer 131 and the second metal layer 132, a conductive material such as copper (Cu), aluminum (Al), silver (Ag), tin (Sn), gold (Au), nickel (Ni), lead (Pb), titanium (Ti), or alloys thereof may be used.

Each of the first metal layer 131 and the second metal layer 132 is not limited to a single metal layer. For example, depending on a manufacturing process, the first metal layer 131 may have a multilayer structure including a seed layer and a plating layer. The second metal layer 132 may also have a multilayer structure.

In the printed circuit board according to another example embodiment, a groove portion may be formed in a pad, and the pad may include a region having a stepped portion, such that a contact area with the insulating layer 110 may increase. Also, as the pad 130 of the printed circuit board in the example embodiment include the region having a stepped portion, the pad 130 may have a plurality of inflection points. Accordingly, the force applied to the pad 130 may be reduced due to the conductive post 150.

The descriptions of the other elements may be substantially the same as in the aforementioned example embodiment with reference to FIG. 3, and thus, detailed descriptions thereof will not be provided.

Figure 7A:
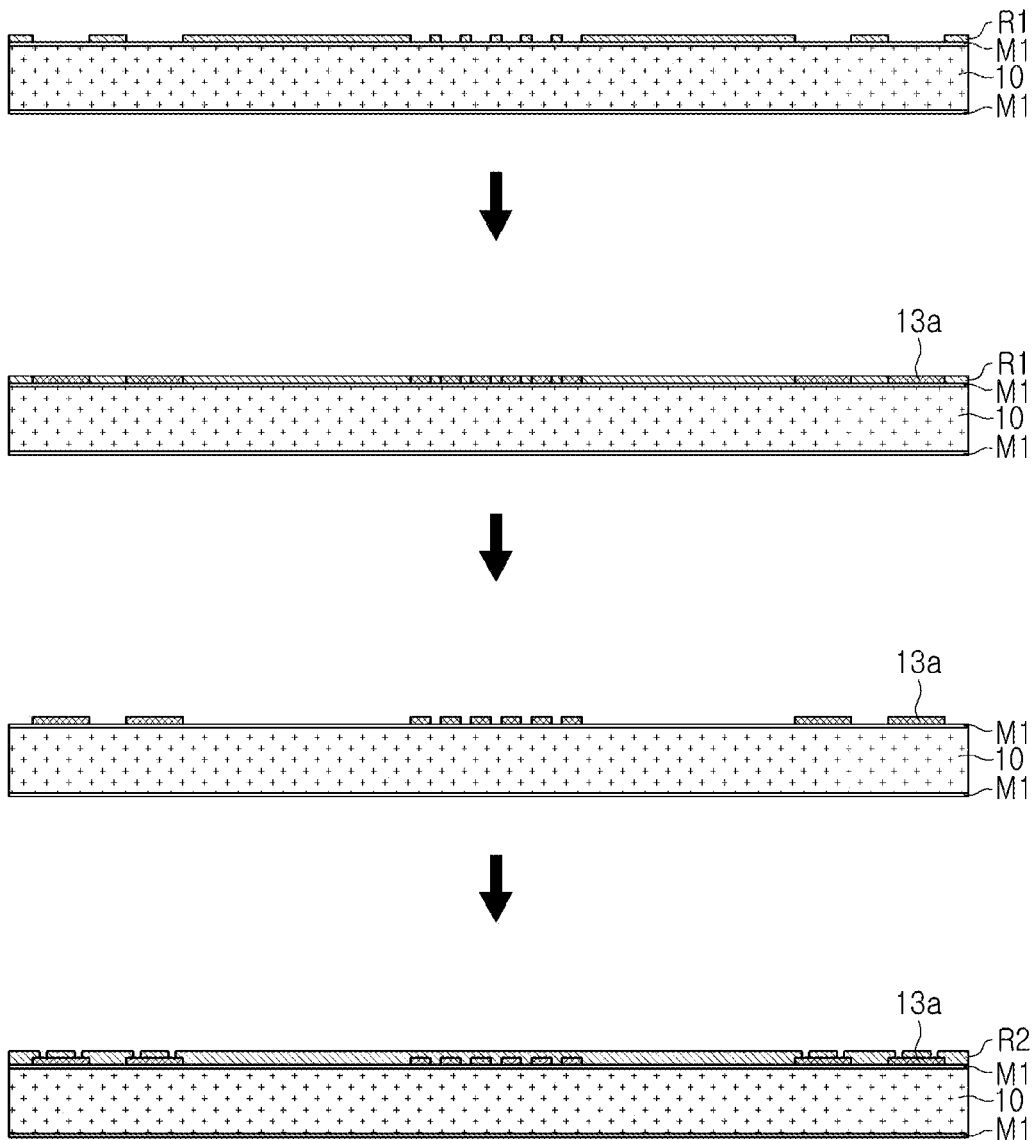
FIGS. 7A and 7B are cross-sectional diagrams illustrating a portion of an example embodiment of a process of manufacturing the printed circuit board illustrated in FIG. 3.
Figure 7B:
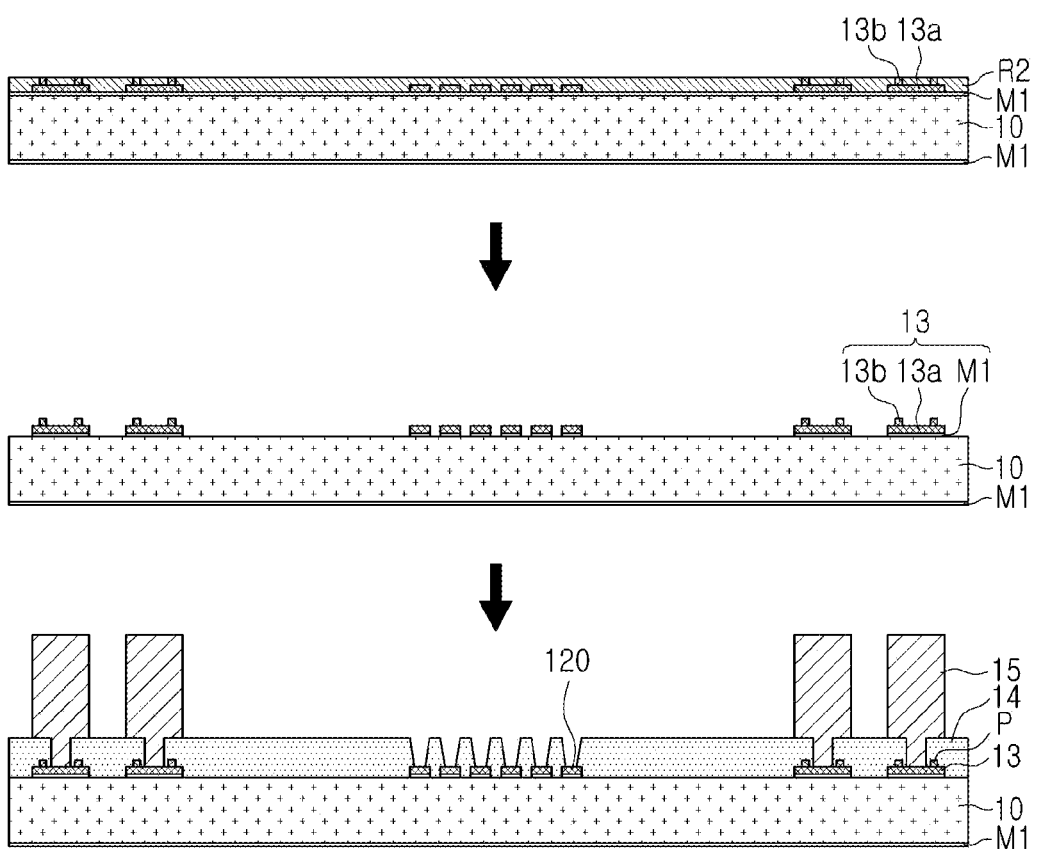

FIGS. 7A and 7B are cross-sectional diagrams illustrating a portion of an example embodiment of a process of manufacturing the printed circuit board illustrated in FIG. 3.

Referring to the diagram, a base substrate in which a metal foil M1 is formed on at least one surface of an insulating substrate 10 may be prepared. The base substrate may be configured as a copper clad laminate (CCL) in which copper foil is laminated on at least one surface of the insulating substrate 10, but an example embodiment thereof is not limited thereto.

Thereafter, a first resist layer R1 may be formed on the metal foil M1. The first resist layer R1 may have an opening in a region corresponding to the first metal layer 13*a*.

A first metal layer 13*a* may be formed on the metal foil M1. In this case, the metal foil M1 may work as a seed layer, and accordingly, the first metal layer 13*a* may be formed through electrolytic plating.

The first resist layer R1 may be removed, and a second resist layer R2 may be formed on the metal foil M1 and the first metal layer 131*a*. The second resist layer R2 may have an opening in a region corresponding to the second metal layer 13*b*.

A second metal layer 13*b* may be formed on the first metal layer 13*a*. In this case, the first metal layer 13*a* may work as a seed layer along with the metal foil M1, and the second metal layer 13*b* may be formed through electrolytic plating.

The second resist layer R2 may be removed, and the metal foil M1 disposed in a region other than the region corresponding to the pad 13 may also be removed by etching. The metal foil M1, the first metal layer 13*a*, and the second metal layer 13*b* may form the pad 13, and the second metal layer 13*b* may form the protrusion P. In this case, the metal foil M1 and the first metal layer 13*a* may correspond to the first metal layer 131 of the printed circuit board in FIG. 3, and the second metal layer 13*b* may correspond to the second metal layer 132 of the printed circuit board in FIG. 3.

By forming the protective layer 14 and the metal post 15, the pad 13 may be connected to the metal post 15. The protective layer 14 may correspond to the protective layer 140 of the printed circuit board in FIG. 3, and the metal post 15 may correspond to the metal post 150 of the printed circuit board in FIG. 3.

The above description is provided to describe an example of the process of manufacturing the printed circuit board according to FIG. 3, and the process of manufacturing the printed circuit board in FIG. 3 is not limited thereto.

Figure 8A:
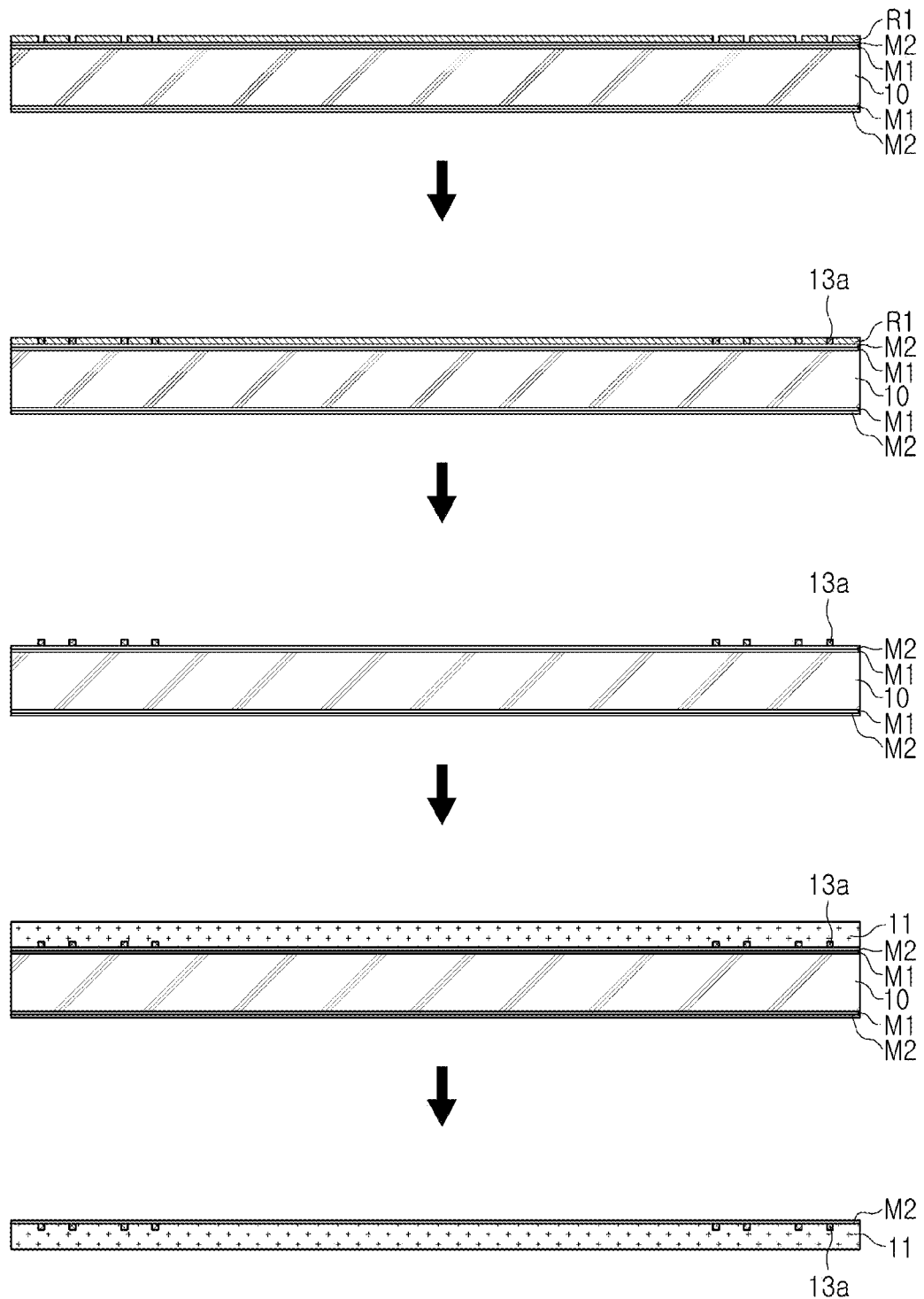
FIGS. 8A and 8B are cross-sectional diagrams illustrating a portion of an example embodiment of a process of manufacturing the printed circuit board illustrated in FIG. 4.
Figure 8B:
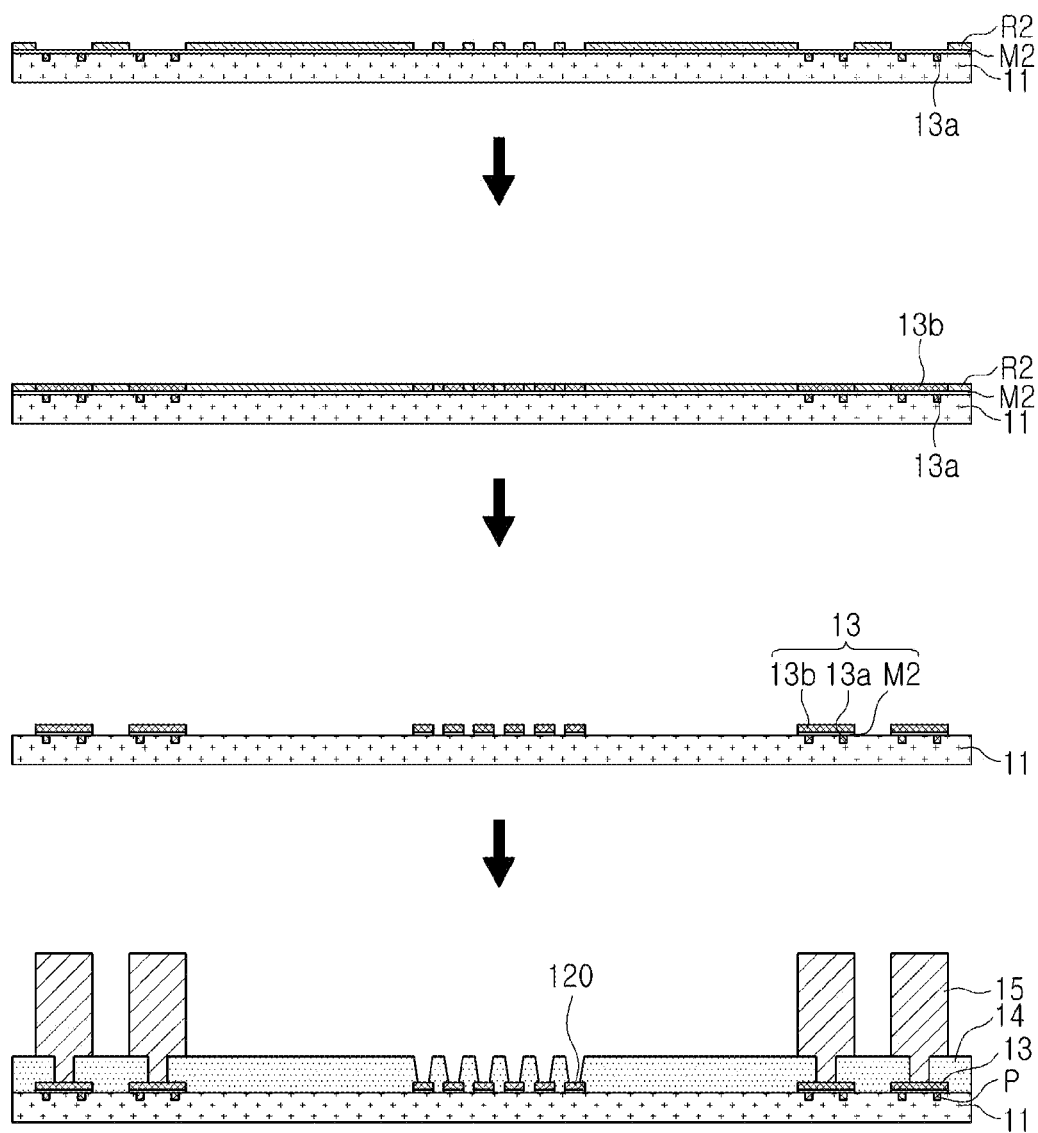

FIGS. 8A and 8B are cross-sectional diagrams illustrating a portion of an example embodiment of a process of manufacturing the printed circuit board illustrated in FIG. 4.

Referring to the diagram, a base substrate in which a first metal foil M1 and a second metal foil M2 are formed on at least one surface of the insulating substrate 10 may be prepared. The base substrate may be configured as a carrier film in which a first copper foil and a second copper foil are laminated on at least one surface of the insulating substrate 10, but an example embodiment thereof is not limited thereto. A release film may be also disposed between the first metal foil M1 and the second metal foil M2.

A first resist layer R1 may be formed on the second metal foil M2. The first resist layer R1 may have an opening in a region corresponding to the first metal layer 13*a*.

A first metal layer 13*a* may be formed on the second metal foil M2. In this case, the second metal foil M2 may work as a seed layer, and thus, the first metal layer 13*a* may be formed through electrolytic plating.

The first resist layer R1 may be removed, and the insulating layer 11 may be laminated on the base substrate on which the first metal layer 13*a* is formed to bury the first metal layer 13*a*.

The first metal foil M1 and the second metal foil M2 may be separated from each other. In this case, a carrier film may be disposed on a surface of the insulating layer 110 opposite to the surface on which the second metal foil M2 is disposed for ease of processing.

A second resist layer R2 may be formed on the second metal foil M2. The second resist layer R2 may have an opening in a region corresponding to the second metal layer 13*b*.

A second metal layer 13*b* may be formed on the second metal foil M2. In this case, the second metal foil M2 may work as a seed layer, and the second metal layer 13*b* may be formed through electrolytic plating.

The second resist layer R2 may be removed, and the second metal foil M2 disposed in a region other than the region corresponding to the pad 13 may also be removed by etching. The second metal foil M2, the first metal layer 13*a*, and the second metal layer 13*b* may form the pad 13, and the first metal layer 13*a* may form the protrusion P. In this case, the second metal layer 13*b* may correspond to the first metal layer 131 of the printed circuit board in FIG. 4, and the second metal foil M2 and the first metal layer 13*a* may correspond to the second metal layer 132 of the printed circuit board in FIG. 4.

By forming the protective layer 14 and the metal post 15, the pad 13 may be connected to the metal post 15. The protective layer 14 may correspond to the protective layer 140 of the printed circuit board in FIG. 4, and the metal post 15 may correspond to the metal post 150 of the printed circuit board in FIG. 4.

The above description is provided to describe an example of the process of manufacturing the printed circuit board according to FIG. 4, and the process of manufacturing the printed circuit board in FIG. 4 is not limited thereto.

Figure 9A:
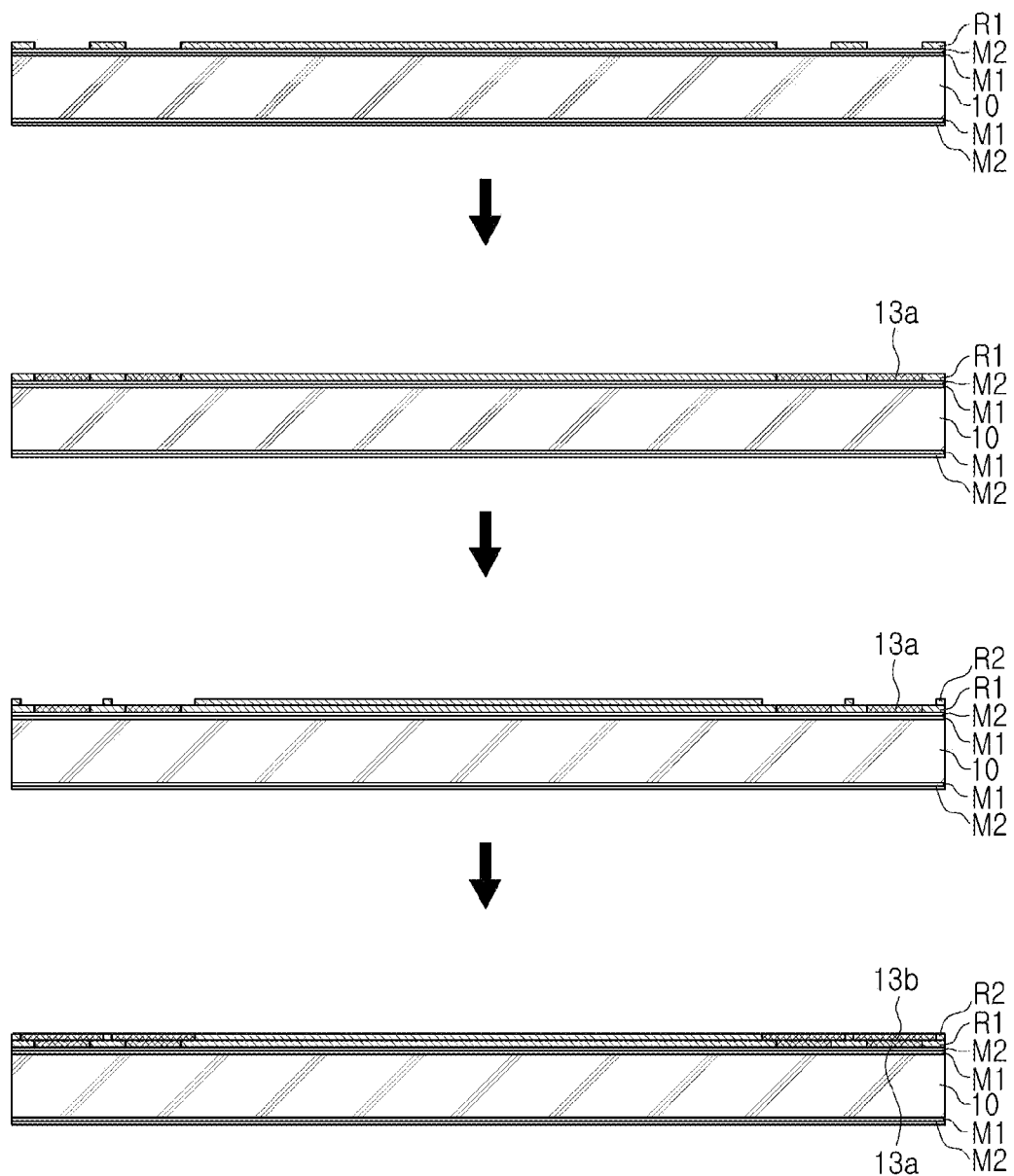
FIGS. 9A and 9B are cross-sectional diagrams illustrating a portion of an example embodiment of a process of manufacturing the printed circuit board illustrated in FIG. 5.
Figure 9B:
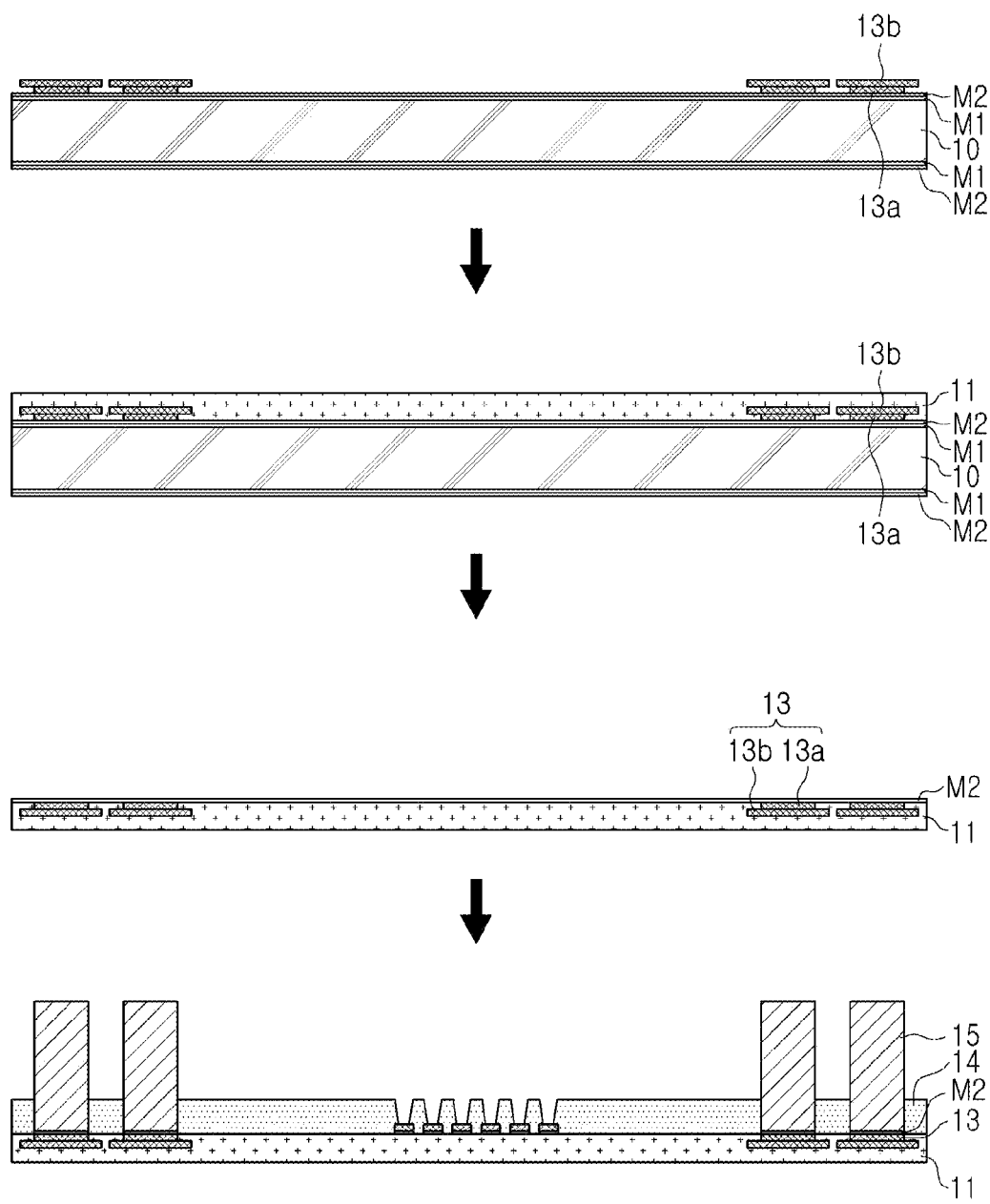

FIGS. 9A and 9B are cross-sectional diagrams illustrating a portion of an example embodiment of a process of manufacturing the printed circuit board illustrated in FIG. 5.

Referring to the diagram, a base substrate in which a first metal foil M1 and a second metal foil M2 are formed on at least one surface of an insulating substrate 10 may be prepared. The base substrate may be configured as a carrier film in which a first copper foil and a second copper foil are laminated on at least one surface of the insulating substrate 10, but an example embodiment thereof is not limited thereto. A release film may be disposed between the first metal foil M1 and the second metal foil M2.

A first resist layer R1 may be formed on the second metal foil M2. The first resist layer R1 may have an opening in a region corresponding to the first metal layer 13*a*.

A first metal layer 13*a* may be formed on the second metal foil M2. In this case, the second metal foil M2 may work as a seed layer, and thus, the first metal layer 13*a* may be formed through electrolytic plating.

A second resist layer R2 may be formed on the first resist layer R1. The second resist layer R2 may have an opening in a region corresponding to the second metal layer 13*b*.

A second metal layer 13b may be formed on the first metal layer 13a. In this case, the first metal layer 13a may work as a seed layer along with the second metal foil M2, and thus, the second metal layer 13b may be formed through electrolytic plating.

The first resist layer R1 and the second resist layer R2 may be removed, the insulating layer 11 may be laminated on the base substrate on which the first metal layer 13a and the second metal layer 13b are formed to bury the first metal layer 13a and the second metal layer 13b.

The first metal foil M1 and the second metal foil M2 may be separated from each other. In this case, a carrier film may be disposed on a surface of the insulating layer 110 opposite to the surface on which the second metal foil M2 is disposed for ease of the process.

A protective layer 14 and a metal post 15 may be formed on the second metal foil M2. In this case, the second metal foil M2 may work as a seed layer, and thus, the metal post may be formed through electrolytic plating. The second metal foil M2 formed in a region other than the region in which the metal post 15 is formed may be removed by etching. The second metal foil M2 and the metal post 15 may form the metal post 150 of the printed circuit board in FIG. 5.

The first metal layer 13a and the second metal layer 13b may form the pad 13. In this case, the first metal layer 13a may correspond to the first metal layer 131 of the printed circuit board in FIG. 5, the second metal layer 13b may correspond to the second metal layer 132 of the printed circuit board in FIG. 5, the protective layer 14 may correspond to the protective layer 140 of the printed circuit board in FIG. 5, and the metal post 15 may correspond to the metal post 150 of the printed circuit board in FIG. 5.

The above description is provided to describe an example of the process of manufacturing the printed circuit board according to FIG. 5, and the process of manufacturing the printed circuit board in FIG. 5 is not limited thereto.

Figure 10A:
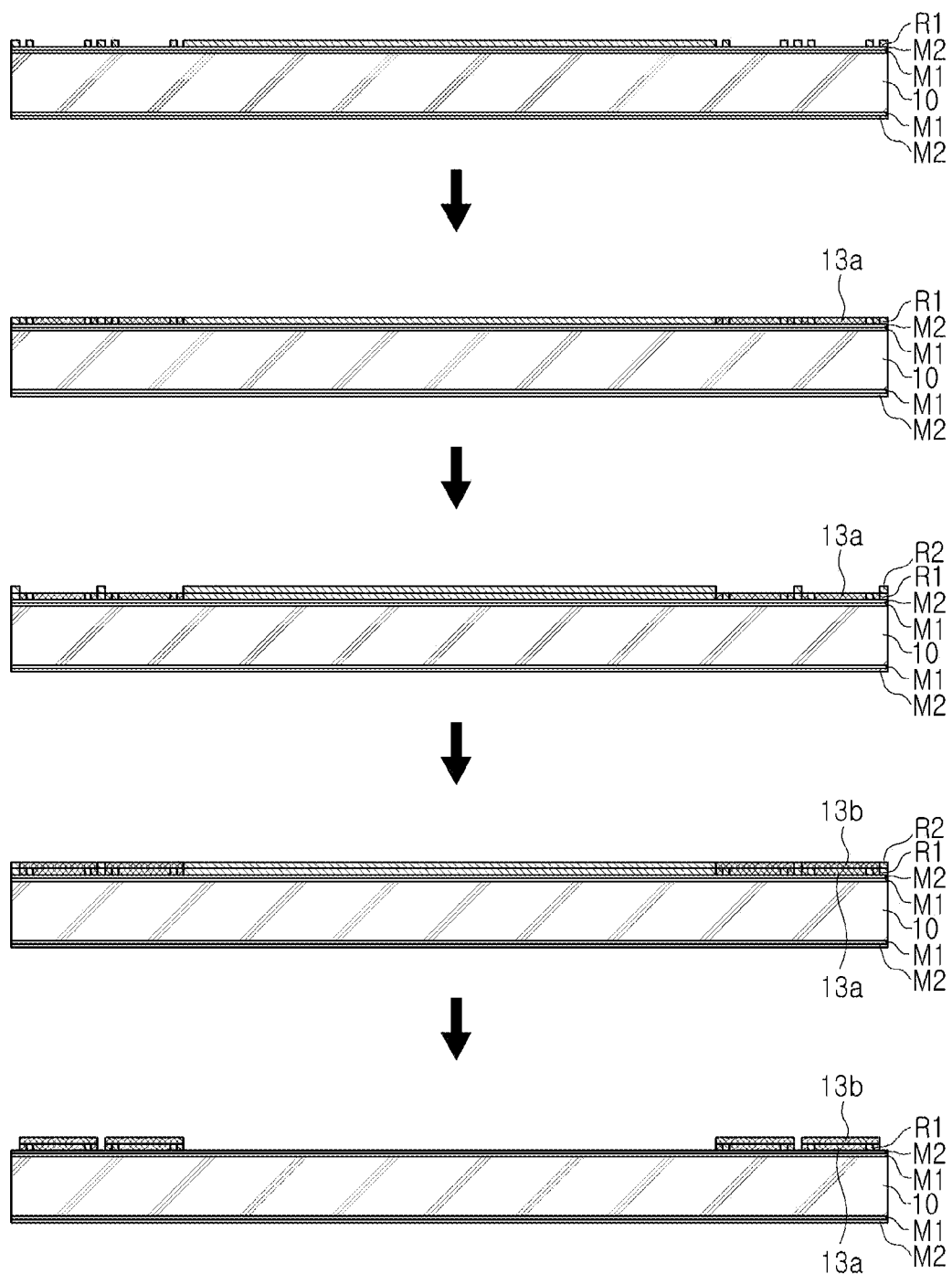
FIGS. 10A and 10B are cross-sectional diagrams illustrating a portion of an example embodiment of a process of manufacturing the printed circuit board illustrated in FIG. 6.
Figure 10B:
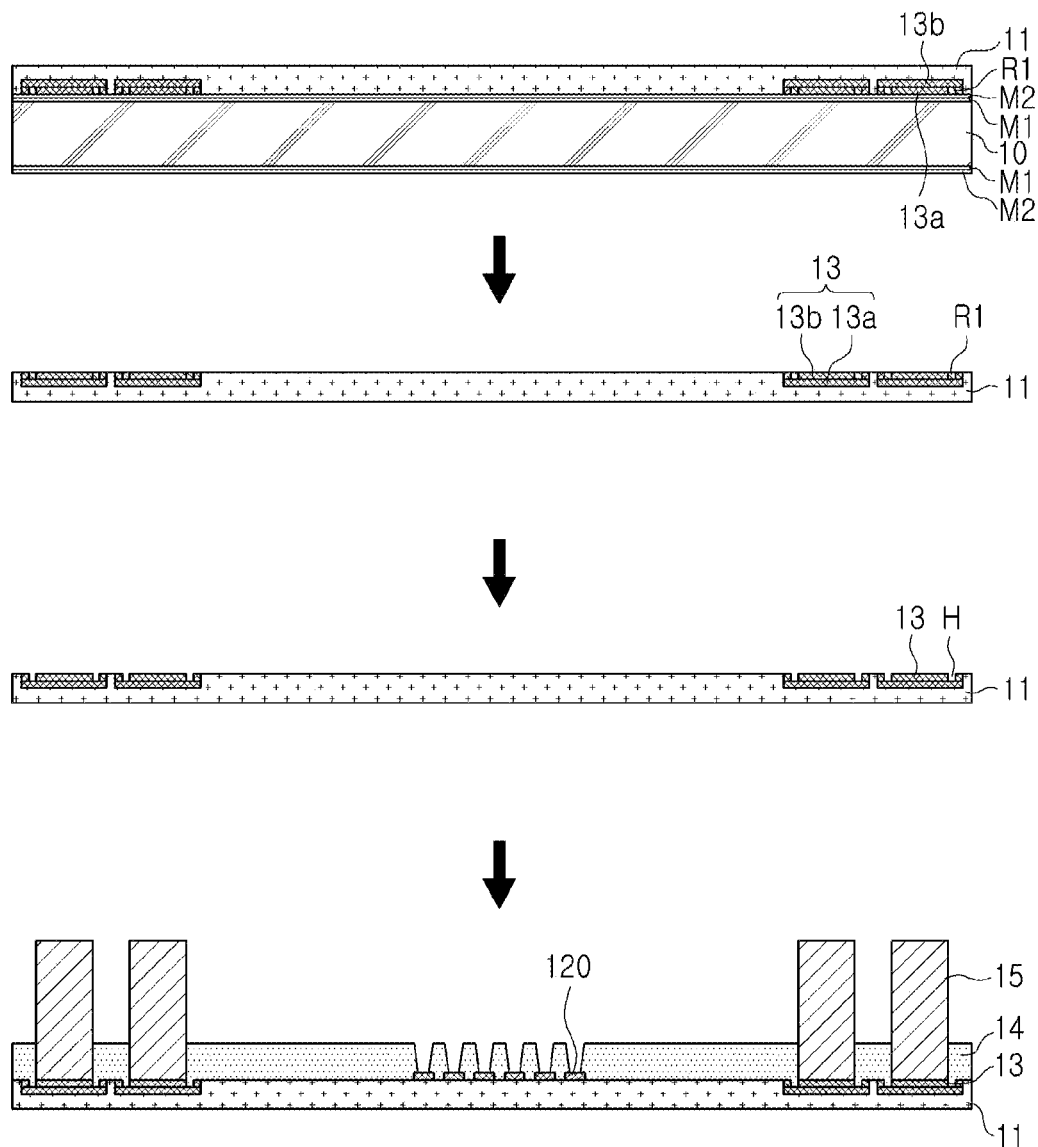

FIGS. 10A and 10B are cross-sectional diagrams illustrating a portion of an example embodiment of a process of manufacturing the printed circuit board illustrated in FIG. 6.

Referring to the diagram, a base substrate in which a first metal foil M1 and a second metal foil M2 are formed on at least one surface of an insulating substrate 10 may be prepared. The base substrate may be configured as a carrier film in which a first copper foil and a second copper foil are laminated on at least one surface of the insulating substrate 10, but an example embodiment thereof is not limited thereto. A release film may be disposed between the first metal foil M1 and the second metal foil M2.

A first resist layer R1 may be formed on the second metal foil M2. The first resist layer R1 may have an opening in a region corresponding to the first metal layer 13a.

A first metal layer 13a may be formed on the second metal foil M2. In this case, the second metal foil M2 may work as a seed layer, and thus, the first metal layer 13a may be formed through electrolytic plating.

A second resist layer R2 may be formed on the first resist layer R1. The second resist layer R2 may have an opening in a region corresponding to the second metal layer 13b.

A second metal layer 13b may be formed on the first metal layer 13a. In this case, the first metal layer 13a may work as a seed layer along with the second metal foil M2, and thus, the second metal layer 13b may be formed through electrolytic plating.

The first resist layer R1 and the second resist layer R2 may be removed. In this case, a region of the first resist layer R1 covered by the second metal layer 13b may not be removed and may remain. Thereafter, the insulating layer 11 may be laminated on the base substrate on which the first metal layer 13a and the second metal layer 13b are formed to bury the first metal layer 13a and the second metal layer 13b.

The first metal foil M1 and the second metal foil M2 may be separated from each other, and a through-portion H may be formed by removing the remaining first resist layer R1. In this case, a carrier film may be disposed on a surface of the insulating layer 110 opposite to the surface on which the second metal foil M2 is disposed for ease of the process.

By forming the protective layer 14 and the metal post 15, the pad 13 may be connected to the metal post 15. In this case, to form the metal post 15, a seed layer may be additionally formed between the first metal layer 13a and the metal post 15.

The first metal layer 13a and the second metal layer 13b may form the pad 13. In this case, the first metal layer 13a may correspond to the first metal layer 131 of the printed circuit board in FIG. 6, the second metal layer 13b may correspond to the second metal layer 132 of the printed circuit board in FIG. 6, the protective layer 14 may correspond to the protective layer 140 of the printed circuit board in FIG. 6, and the metal post 15 may correspond to the metal post 150 of the printed circuit board in FIG. 6.

The above description is provided to describe an example of the process of manufacturing the printed circuit board according to FIG. 6, and the process of manufacturing the printed circuit board in FIG. 6 is not limited thereto.

According to the aforementioned example embodiments, a printed circuit board including a pad having an increased contact area with an insulating material may be provided.

Also, a printed circuit board including a plurality of inflection points may be provided.

Further, a printed circuit board which may reduce force applied to a pad may be provided.

In the example embodiment, the expression that an element is "disposed" on another element is not intended to set a direction. Accordingly, the expression that an element is "disposed" on another element may indicate that the element is disposed on an upper side of another element or on a lower side.

In the example embodiments, the term "connected" may not only refer to "directly connected" but also include "indirectly connected" by means of an adhesive layer, or the like. Also, the term "electrically connected" may include both of the case in which elements are "physically connected" and the case in which elements are "not physically connected."

The terms "first," "second," and the like may be used to distinguish one element from the other, and may not limit a sequence and/or an importance, or others, in relation to the elements. In some cases, a first element may be referred to as a second element, and similarly, a second element may be referred to as a first element without departing from the scope of right of the example embodiments.

In the example embodiments, the term "example embodiment" may not refer to one same example embodiment, and may be provided to describe and emphasize different unique features of each example embodiment. The above suggested example embodiments may be implemented do not exclude the possibilities of combination with features of other example embodiments. For example, even though the features described in one example embodiment are not described in the other example embodiment, the description may be understood as relevant to the other example embodiment unless otherwise indicated.

An expression used in the singular encompasses the expression of the plural, unless it has a clearly different meaning in the context.

While the example embodiments have been illustrated and described above, it will be apparent to those skilled in the art that modifications and variations could be made without departing from the scope of the present invention as defined by the appended claims.

What is claimed is:

1. A printed circuit board, comprising:
a first insulating layer;
a pad disposed in the insulating layer and having a protrusion;
another pad disposed on the insulating layer; and
a protective layer disposed on the insulating layer and having an opening exposing at least a portion of the pad and of the another pad,
wherein the protrusion protrudes from one surface of the pad and is buried in the insulating layer, and
wherein a top surface of the another pad is higher than a top surface of the pad and lower than a top surface of the protective layer.

2. The printed circuit board of claim 1, wherein the pad includes a first metal layer and a second metal layer disposed on the first metal layer and provided as the protrusion.

3. The printed circuit board of claim 2,
wherein the first metal layer is disposed in the insulating layer, and
wherein the second metal layer is disposed on a surface of the first metal layer opposing the protective layer.

4. The printed circuit board of claim 3, wherein one surface of the second metal layer is coplanar with one surface of the insulating layer.

5. The printed circuit board of claim 2, wherein one surface of the pad is coplanar with one surface of the second metal layer.

6. The printed circuit board of claim 1, wherein the protrusion includes a plurality of protrusions spaced apart from each other.

7. The printed circuit board of claim 1, further comprising:
a conductive post disposed on the insulating layer and connected to the pad.

8. A printed circuit board, comprising:
an insulating layer;
a pad buried in the insulating layer to be exposed to one surface of the insulating layer and including a first metal layer and a second metal layer disposed on the first metal layer;
another pad disposed on the insulating layer;
a protective layer disposed on the insulating layer and having an opening exposing at least a portion of the pad and of the another pad; and
a conductive post disposed in the opening of the protective layer, protruding from the protective layer, and connected to the pad,
wherein a top surface of the another pad is higher than a top surface of the pad and lower than a top surface of the protective layer.

9. The printed circuit board of claim 8, wherein the pad includes a region having a stepped portion.

10. The printed circuit board of claim 8, wherein a width of the first metal layer is different from a width of the second metal layer.

11. The printed circuit board of claim 8, wherein the second metal layer has a through-portion exposing the first metal layer.

12. The printed circuit board of claim 11, wherein the protective layer is disposed in the through-portion.

13. A printed circuit board, comprising:
an insulating body;
a pad disposed in the insulating body and including a first metal layer and a second metal layer;
another pad disposed on the insulating layer;
a protective layer disposed on the insulating body and having an opening exposing at least a portion of the pad and of the another pad; and
a conductive post extending from the first metal layer to protrude from the insulating body,
wherein the second metal layer is spaced apart from the conductive post, and
wherein a top surface of the another pad is higher than a top surface of the pad and lower than a top surface of the protective layer.

14. The printed circuit board of claim 13, wherein the second metal layer includes one or more protrusions extending from the first metal layer and embedded in the insulating body.

15. The printed circuit board of claim 14, wherein the one or more protrusions and the conductive post are disposed on a same one side of the first metal layer.

16. The printed circuit board of claim 13, wherein a width of the first metal layer is different from a width of the second metal layer.

17. The printed circuit board of claim 16, wherein the second metal layer has a through-portion exposing a portion of the first metal layer.

18. The printed circuit board of claim 16, wherein side surfaces of the first metal layer and the second metal layer provide a step.

* * * * *